(12) United States Patent
Stakely et al.

(10) Patent No.: US 6,271,698 B1
(45) Date of Patent: Aug. 7, 2001

(54) METHOD AND APPARATUS FOR CORRECTING IMPERFECTLY EQUALIZED BIPOLAR SIGNALS

(75) Inventors: Barry L. Stakely, Snowcamp, NC (US); Ernesto Jaritz, Shelton, CT (US); Phillip R. Epley; Alexis Shishkoff, both of Raleigh, NC (US)

(73) Assignee: Transwitch Corp, Shelton, CT (US)

(*) Notice: Subject to any disclaimer, the term of this patent is extended or adjusted under 35 U.S.C. 154(b) by 0 days.

(21) Appl. No.: 09/441,976

(22) Filed: Nov. 17, 1999

(51) Int. Cl.[7] .................................................. H03K 5/01
(52) U.S. Cl. ............................................. 327/164; 327/34
(58) Field of Search ........................ 327/34, 164; 341/57, 341/73; 375/348, 349, 350, 351, 232, 254, 289

(56) References Cited

U.S. PATENT DOCUMENTS

| 3,671,959 | * | 6/1972 | Amano ................................... 341/57 |
| 4,760,279 | * | 7/1988 | Saito et al. ............................. 327/34 |
| 5,760,612 | * | 6/1998 | Ramirez ................................. 327/34 |

FOREIGN PATENT DOCUMENTS

| 356032824 | * | 4/1981 | (JP) ....................................... 327/34 |
| 406132791 | * | 5/1994 | (JP) ....................................... 327/34 |

* cited by examiner

*Primary Examiner*—Tuan T. Lam
(74) *Attorney, Agent, or Firm*—David P. Gordon; David S Jacobson; Thomas A Gallagher

(57) ABSTRACT

An apparatus for correcting imperfectly equalized bipolar signals includes a delay line having a reset control, an AND gate, and a one-shot multivibrator. The apparatus is used in conjunction with an adaptive equalizer with the output of the adaptive equalizer being coupled to the input of the apparatus of the invention. More particularly, the output of the equalizer is coupled to the input and reset of the delay as well as to one input of the AND gate. The output of the delay line is coupled to the other input of the AND gate. The output of the AND gate is coupled to the input of the one-shot multivibrator and the output of the one-shot multivibrator is the corrected signal. The delay line is approximately equal to the pulse width of an erroneous pulse which is expected from over-equalization. When the delayed signal is compared to the original signal via the AND gate, narrow pulses are removed from the signal. The one-shot multivibrator is configured such that each pulse entering it from the output of the AND gate cause a pulse of a set length to be generated by the one-shot multivibrator. The output of the one-shot multivibrator therefore contains pulses of equal length. If a pulse from the equalizer is too narrow to be a valid bit, it causes the delay to reset.

9 Claims, 5 Drawing Sheets

METHOD AND APPARATUS FOR CORRECTING IMPERFECTLY EQUALIZED BIPOLAR SIGNALS

BACKGROUND OF THE INVENTION

1. Field of the Invention

The invention relates to telecommunications. More particularly, the invention relates to a method and apparatus for correcting imperfectly equalized bipolar signals.

2. State of the Art

The first commercial digital voice communications system was installed in 1962 in Chicago, Ill. The system was called "T1" and was based on the time division multiplexing (TDM) of twenty-four telephone calls on two twisted wire pairs. The digital bit rate of the T1 system was 1.544 Mbit/sec (±200 bps), which was, in the nineteen sixties, about the highest data rate that could be supported by a twisted wire pair for a distance of approximately one mile. The cables carrying the T1 signals were buried underground and were accessible via manholes, which were, at that time in Chicago, spaced approximately one mile (actually, 6000 ft.) apart. Thus, analog amplifiers with digital repeaters were conveniently located at intervals of approximately one mile.

The T1 system is still widely used today and forms a basic building block for higher capacity communication systems including T3 which transports twenty-eight T1 signals. The designation T1 was originally coined to describe a particular type of carrier equipment. Today T1 is often used to refer to a carrier system, a data rate, and various multiplexing and framing conventions. While it is more accurate to use the designation "DS1" when referring to the multiplexed digital signal formed at an 8 KHz rate and used to carry twenty-four voice channels by the T1 carrier, the designations DS1 and T1 are often used interchangeably. Today, T1/DS1 systems still have a data rate of 1.544 Mbit/sec and support up to twenty-four voice and/or data DS0 channels. Similarly, the designations DS2 and T2 both refer to a system transporting up to four DS1 signals (96 DS0 channels) and the designations DS3 and T3 both refer to a system transporting up to seven DS2 signals (672 DS0 channels). The timing tolerance for modern T1 equipment has been raised to ±50 bps. The T1 and T2 standards are utilized in North America and Japan. Similar, but incompatible, standards called E1 and E2 are utilized in Europe. The T3 standard is utilized in North America and a similar, but incompatible, standard called E3 is utilized in Europe. In the 1980s, fiber optic technology called SONET (synchronous optical network) provided a measure of compatability between T3 and E3 by allowing both to be mapped into an STS-1 signal.

The current standard for T1/DS1 systems incorporates many improvements and enhancements over the original T1 system. The basic T1 system is based on a frame of 193 bits, i.e. twenty-four 8-bit channels (the payload) and one framing bit (F). According to today's standards, the 192 bit payload need not be "channelized" into 24 DS0 channels. In addition, superframe and extended superframe formats have been defined. The superframe (SF) format is composed of twelve consecutive T1 frames, i.e. approximately 1.5 milliseconds of a T1 signal. In the SF format, the twelve framing bits F are divided into two groups, six terminal framing bits $F_t$ and six signalling framing bits $F_s$. The $F_t$ bits are used to identify frame boundaries and the $F_s$ bits are used to identify superframe boundaries. When the frames are DS0 channelized, the $F_s$ bits are also used to identify signalling frames. The extended superframe (ESF) format is composed of twenty-four consecutive T1 frames, i.e., approximately 3 milliseconds of a T1 signal. In the ESF format, the twenty-four F bits are divided into three groups. Six F bits are used to provide a 2 kbps framing pattern sequence (FPS) which is used to identify the frame and ESF boundaries. When the frames are DS0 channelized, the FPS is to identify signalling frames. Another six of the F bits are used to provide a 2 kbps CRC (cyclic redundancy check error checking) channel utilizing a CRC-6 code. The remaining twelve F bits are used to provide a 4 kbps data link (DL) channel. The DL channel is sometimes referred to as the "FDL channel" or "FDL link" where DL stands for data link and F stands for facility or facilities.

In addition to modern framing conventions, the present T1 specification also includes provisions for different "line codes", sometimes referred to as "transmission codes". It will be appreciated that the T1 signal is a plesiochronous (tightly controlled asynchronous) signal and, unlike a synchronous signal, is still subject to wander, jitter, and slips. Line codes are signalling conventions which are designed to facilitate frame synchronization and error detection. One popular line code is known generally as alternate mark inversion (AMI or bipolar line code). AMI utilizes a ternary signal (positive, negative, and null) to convey binary digits (zero and one). Successive binary ones are represented by signal elements of alternate polarity and of equal magnitude. Binary zeros are represented by signal elements having zero amplitude. Under the AMI line code, a non-zero signal element which follows a non-zero signal element of the same polarity is called a "bipolar violation".

Prior art FIG. 1 illustrates the bipolar signal for the binary digits 1011. The horizontal lines in FIG. 1 illustrate switching thresholds. When the signal shown in FIG. 1 is received by a "data slicer", the voltage levels are analyzed and if the voltage crosses either threshold, a binary 1 is detected. FIG. 1 illustrates an ideal signal where the timing of the pulses is virtually perfect. Prior art FIG. 4 illustrates how the signal of FIG. 1 appears as "logic levels" to the data slicer receiving it. This virtually perfect signal has correct pulses with correct duration (pulse width).

Signals that are transmitted over coaxial cable or stored on a magnetic medium are susceptible to inter-symbol interference (ISI). ISI occurs when the frequencies making up the transmitted waveform undergo different time delays when traveling to the receiver. The individual pulses become "smeared" together. This makes it difficult for the receiver to determine the correct logic levels. The solution to the problem of ISI is to use an "equalizer" at the receiver which reverses the time delays caused by the transmission medium. An ideal equalizer is a filter having a frequency response which is inverse to that of the medium which caused the ISI. In practice, ISI is variable and the equalizer must constantly adapt, via a feedback network, to the changing frequency response of the transmission medium. Such an equalizer is called an "adaptive equalizer".

Prior art FIG. 2 illustrates the signal of FIG. 1 after it has travelled through a length of coaxial cable. The ISI introduced into the signal distorts the signal by slowing the rise and fall times such that some pulses may fail to cross the switching threshold. Without equalization this signal will be received as having the logic levels shown in FIG. 5. The ISI introduced into the signal will cause it to be misinterpreted as representing the binary digits 1010 rather than 1011.

Prior art FIG. 3 illustrates the signal of FIG. 1 after it has travelled through a length of coaxial cable and after it has passed through an adaptive equalizer. This signal will be received as having the logic levels shown in FIG. 6. Since most equalizers have a high pass frequency response and thus act like a differentiator, transitions are exaggerated. These exaggerated transitions can be seen in FIG. 3 following each pulse. Sometimes, the exaggerated transition can result in a false pulse like the second pulse in FIG. 3. This false pulse is likely to be of shorter duration than a genuine pulse.

In both cases of FIG. 2 (under-equalization) and FIG. 3 (over-equalization) pulses of incorrect duration result, i.e. pulses which are too wide or too narrow (FIGS. 5 and 6). In addition, false bits can occur in the case of overequalization. If pulses are too wide, they may be interpreted as an erroneous bipolar violation by the receiver logic. If the pulses are too narrow, indicating overequalization, two error conditions can occur. First, a narrow pulse representing a valid data bit may be interpreted as a zero by the receiver logic. Second, a narrow pulse produced by an overshoot of the falling edge of a valid bit may be interpreted as a false one by the receiver logic.

SUMMARY OF THE INVENTION

It is therefore an object of the invention to provide a method and apparatus for digitally correcting imperfectly equalized bipolar signals.

It is also an object of the invention to provide a method and apparatus for eliminating erroneous pulses from an over-equalized bipolar signal.

It is another object of the invention to provide a method and apparatus for correcting the pulse width of an equalized bipolar signal.

It is still another object of the invention to eliminate erroneous bipolar violations from an equalized bipolar signal.

In accord with these objects which will be discussed in detail below, the apparatus of the present invention includes at least one delay line having a reset control, at least one AND gate, and at least one one-shot multivibrator. The apparatus is used in conjunction with an adaptive equalizer having a slicer which converts the equalized bipolar analog signal into two digital signals, i.e. a positive bit pulse stream and a negative bit pulse stream. The output of the adaptive equalizer is coupled via the slicer to the input of the apparatus of the invention. More particularly, each output of the slicer is coupled to the input and reset of a respective one of the delay lines as well as to one input of a respective one of the AND gates. The output of each delay line is coupled to the other input of the respective AND gate. The output of each AND gate is coupled to the input of the respective one-shot multivibrator and the output of each one-shot multivibrator is a corrected signal.

According to one method of the invention, the time delay is approximately equal to the pulse width of an erroneous pulse which is expected from over equalization. When the delayed signal is compared to the original signal via the AND gate, narrow pulses are removed from the signal. The output of the AND gate contains only pulses which were wide enough in the original signal that they overlapped in time with the pulses in the delayed signal. According to another aspect of the invention, the one-shot multivibrator is configured such that each pulse entering it from the output of the AND gate causes a pulse of a set length to be generated by the one-shot multivibrator. The output of the one-shot multivibrator therefore contains pulses of equal length, thereby setting received bits to the proper width. According to another aspect of the invention, if a pulse from the equalizer is wide enough to bleed into an adjacent data bit, a pulse of the opposite polarity will cause the delay line to reset and restart the process. This reset will also activate if a narrow pulse is followed by a narrow gap and then followed by a pulse of proper width.

Additional objects and advantages of the invention will become apparent to those skilled in the art upon reference to the detailed description taken in conjunction with the provided figures.

DETAILED DESCRIPTION OF THE PREFERRED EMBODIMENTS

Figure 7:
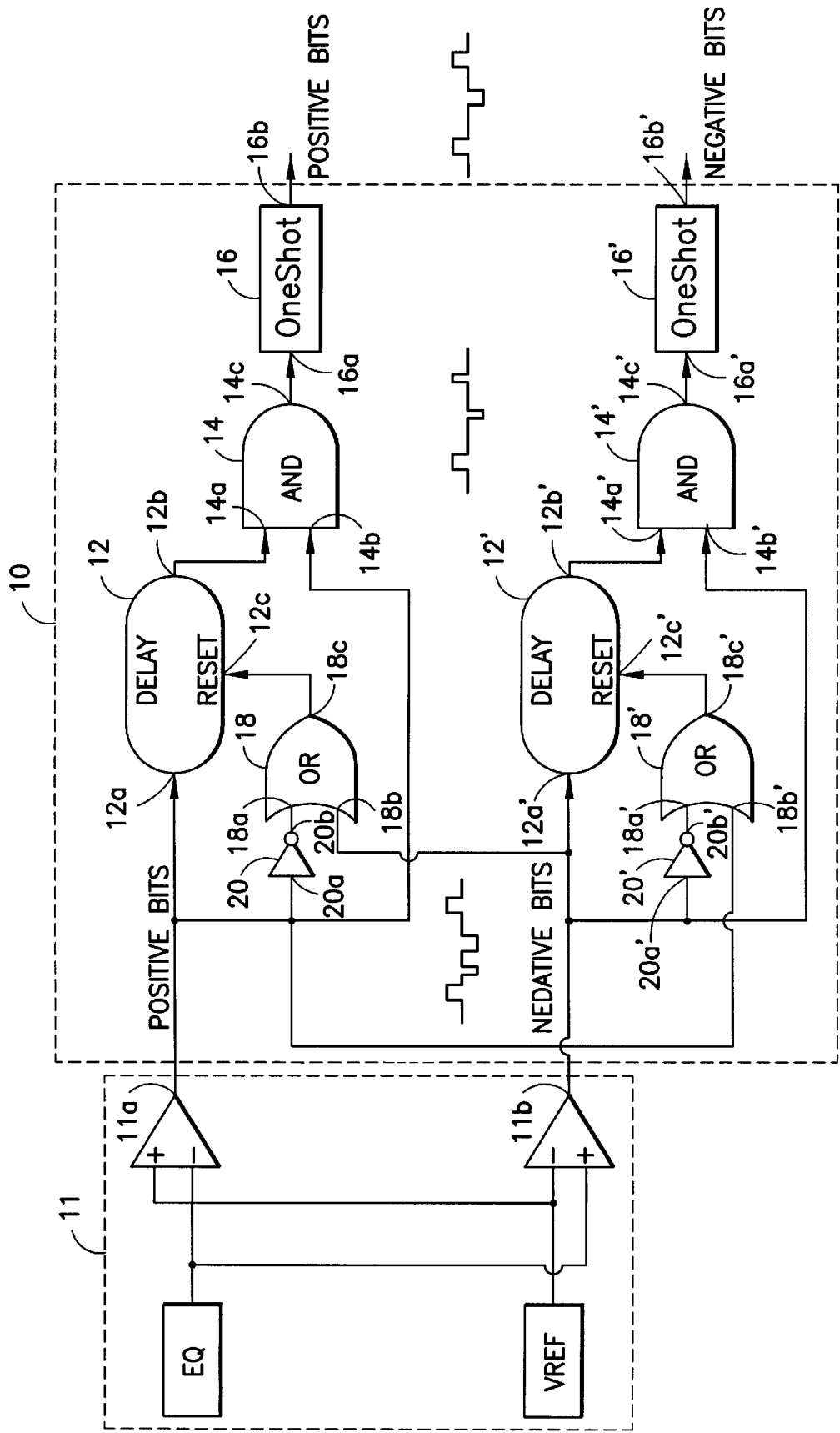
FIG. 7 is a high level block diagram of a apparatus according to the invention.

Referring now to FIG. 7, the apparatus 10 of the present invention 10 is intended to be used with an adaptive equalizer/slicer 11, hereinafter referred to generally as an equalizer, having a positive bits output 11a and a negative bits output 11b. The apparatus 10 includes a circuit for the positive bits and a circuit for the negative bits. More particularly, for the positive bits, the invention includes a delay line 12 having an input 12a, an output 12b, and a reset control 12c, an AND gate 14 having two inputs 14a, 14b and an output 14c, a one-shot multivibrator 16 having an input 16a and an output 16b, an OR gate 18 having two inputs 18a, 18b and an output 18c, and an inverter 20 having an input 20a and an output 20b. For the negative bits, the invention includes a delay line 12' having an input 12a', an output 12b', and a reset control 12c', an AND gate 14' having two inputs 14a', 14b' and an output 14c', a one-shot multivibrator 16' having an input 16a' and an output 16b' an OR gate 18' having two inputs 18a', 18b' and an output 18c', and an inverter 20' having an input 20a' and an output 20b'.

The positive bits output 11a of the equalizer is coupled to the input 12a of the delay line 12 as well as to one input 14a of the AND gate 14. The output 12b of the delay line is coupled to the other input 14b of the AND gate 14. The output 14c of the AND gate 14 is coupled to the input 16a of the one-shot multivibrator 16 and the output of the one-shot multivibrator is the corrected positive bits signal. The output 18c of the OR gate 18 is coupled to the reset input 12c of the delay line. Input 18a of the OR gate 18 is coupled to the output 20b of the inverter 20, the input of which 20a is coupled to the positive bits output 11a of the equalizer. Input 18b of the OR gate 18 is coupled to the negative bits output 11b of the equalizer.

The negative bits output 11b of the equalizer is coupled to the input 12a' of the delay line 12' as well as to one input 14a' of the AND gate 14' and to one input 18b of the OR gate of the positive bits circuit. The output 12b' of the delay line is coupled to the other input 14b' of the AND gate 14'. The output 14c' of the AND gate 14' is coupled to the input 16a' of the one-shot multivibrator 16' and the output of the one-shot multivibrator is the corrected negative bits signal. The output 18c' of the OR gate 18' is coupled to the reset input 12c' of the delay line. Input 18a' of the OR gate 18' is coupled to the output 20b' of the inverter 20', the input of which 20a' is coupled to the negative bits output 11a' of the equalizer. Input 18b' of the OR gate 18' is coupled to the positive bits output 11a of the equalizer.

Figure 1:
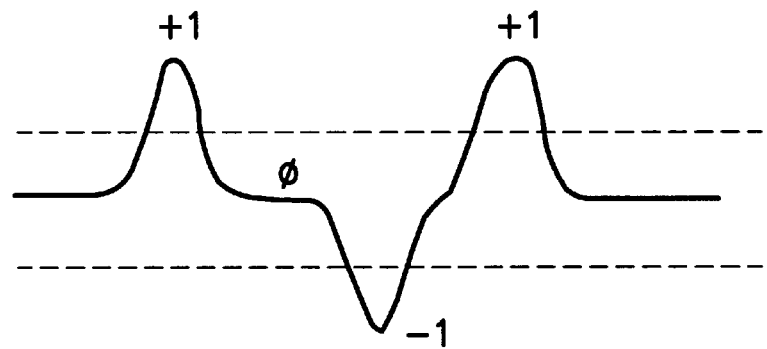
FIG. 1 is a prior art wave diagram of a bipolar signal without any inter-symbol interference.
Figure 2:
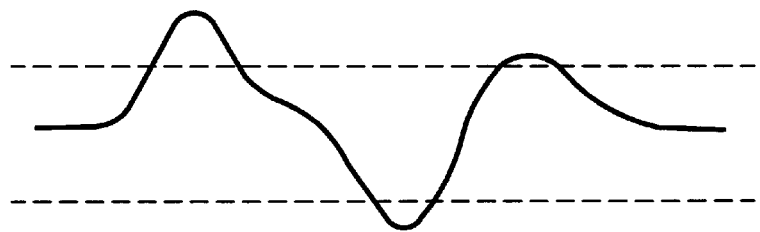
FIG. 2 is a prior art wave diagram of the signal of FIG. 1 after it has passed through a transmission medium causing inter-symbol interference.
Figure 3:
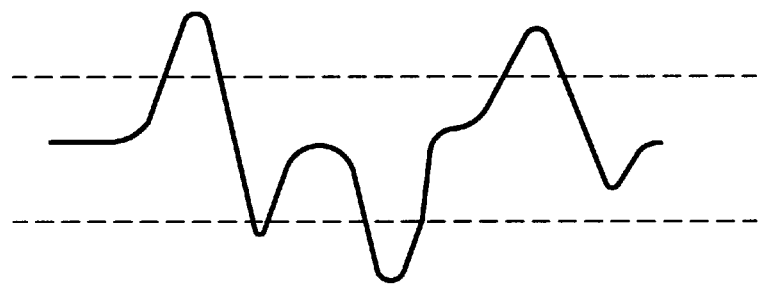
FIG. 3 is a prior art wave diagram of the signal of FIG. 1 after it has passed through a transmission medium causing inter-symbol interference and after it has passed through an adaptive equalizer.
Figure 4:
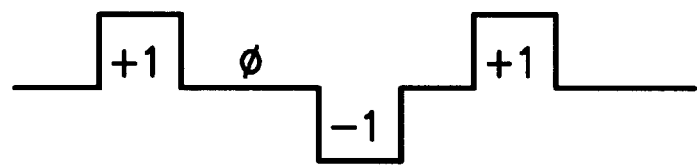
FIG. 4 is a prior art pulse diagram of the signal of FIG. 1 as interpreted by a data slicer.
Figure 5:
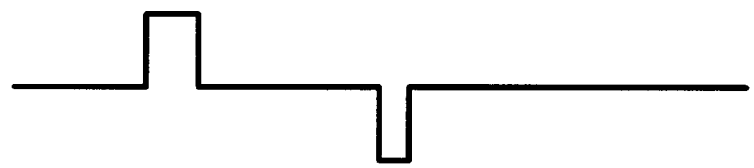
FIG. 5 is a prior art pulse diagram of the signal of FIG. 2 as interpreted by a data slicer.
Figure 6:
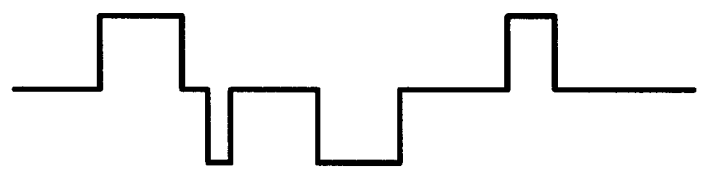
FIG. 6 is a prior art pulse diagram of the signal of FIG. 3 as interpreted by a data slicer.
Figure 8:
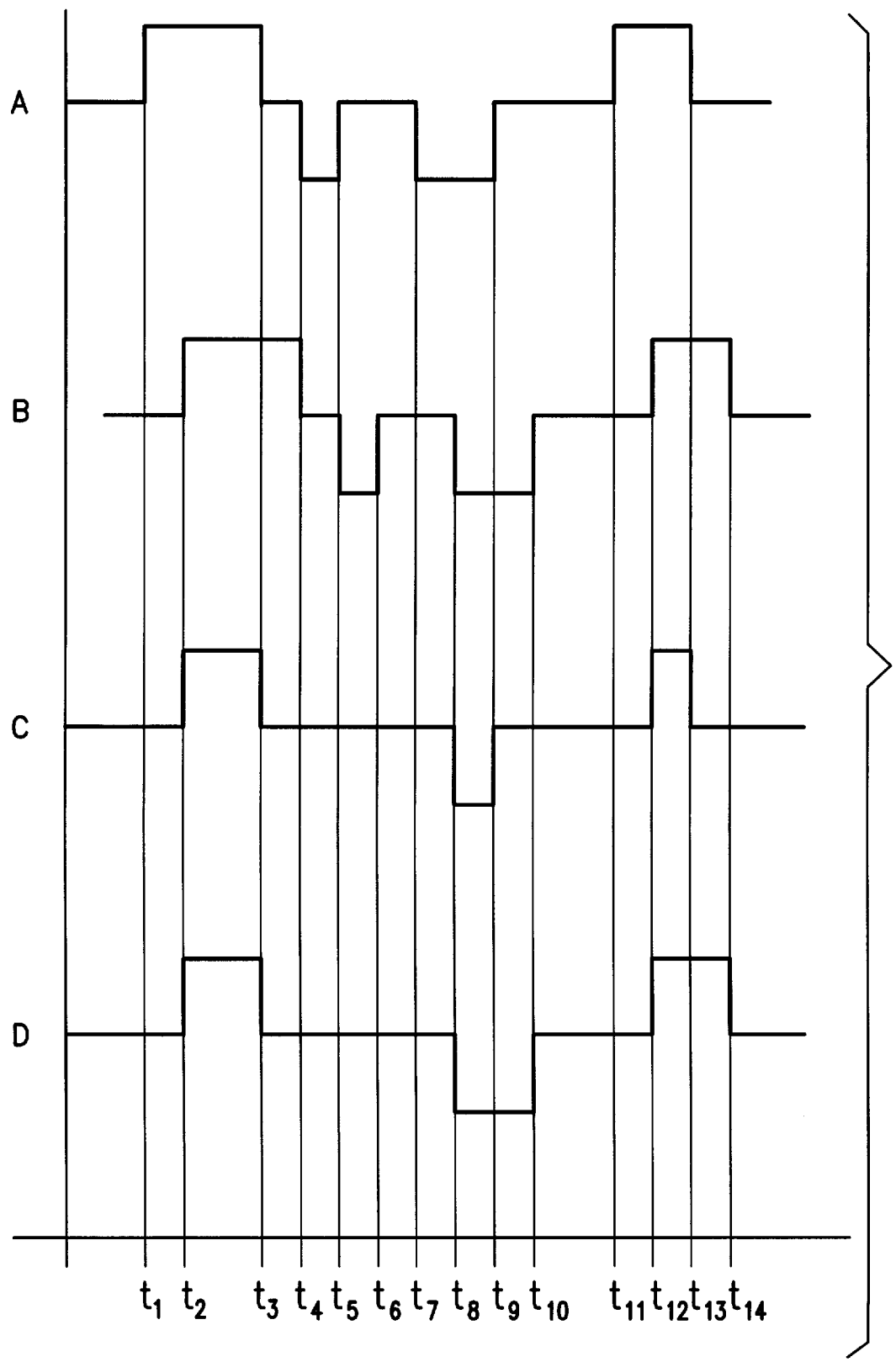
FIG. 8 is a timing diagram illustrating how the signal of FIG. 6 is corrected by the apparatus of FIG. 7.

According to one aspect of the invention, the time delay of the delay lines 12, 12' is approximately equal to the pulse width of an erroneous pulse which is expected from over-equalization, e.g. a pulse width of between 20–40% of proper pulse width. When the delayed signal is compared to the original signal via the AND gates 14, 14', narrow pulses are removed from the signal. This method is more clearly understood with reference to FIG. 8. The first signal "A" in FIG. 8 is substantially the same as the over-equalized signal discussed above with reference to FIGS. 3 and 6. The second pulse, between t4 and t5 is an erroneous pulse having a width of (t5–t4). The second signal "B" in FIG. 8 is substantially identical to the signal "A" but is delayed by a time (t2–t1) which is preferably slightly greater than the pulse width (t5–t4) of the erroneous pulse(s). Signal "B" is the output of the delay line. Signal "C" in FIG. 8 is the output of the AND gate. The first pulse in signal "C" begins at time t2 and ends at time t3 resulting in a pulse which is somewhat narrower than the first pulse of signal "A". The second pulse in signal "A" appears immediately after the first pulse in signal "B" at time t4 and ends at time t5 before the appearance of the second pulse in signal "B" which appears at time t5 and ends at time t6. The ANDing of the signals "A" and "B" results in the omission of the second pulse from signal "C". Signal "C" does contain the third and fourth pulses from signal "A" because the delayed signal "B" still has these pulses overlapping in time with the signal "A". It will be appreciated, however, that the second and third pulses in signal "C" are substantially narrower than the original pulses in signals "A" and "B".

According to another aspect of the invention, the one-shot multivibrators 16 and 16' are configured such that the pulses entering it from the output of the AND gates 14 and 14' cause a pulses of set length to be generated by the one-shot multivibrators. The output of the one-shot multivibrators is shown as signal "D" in FIG. 8.

Figure 9:
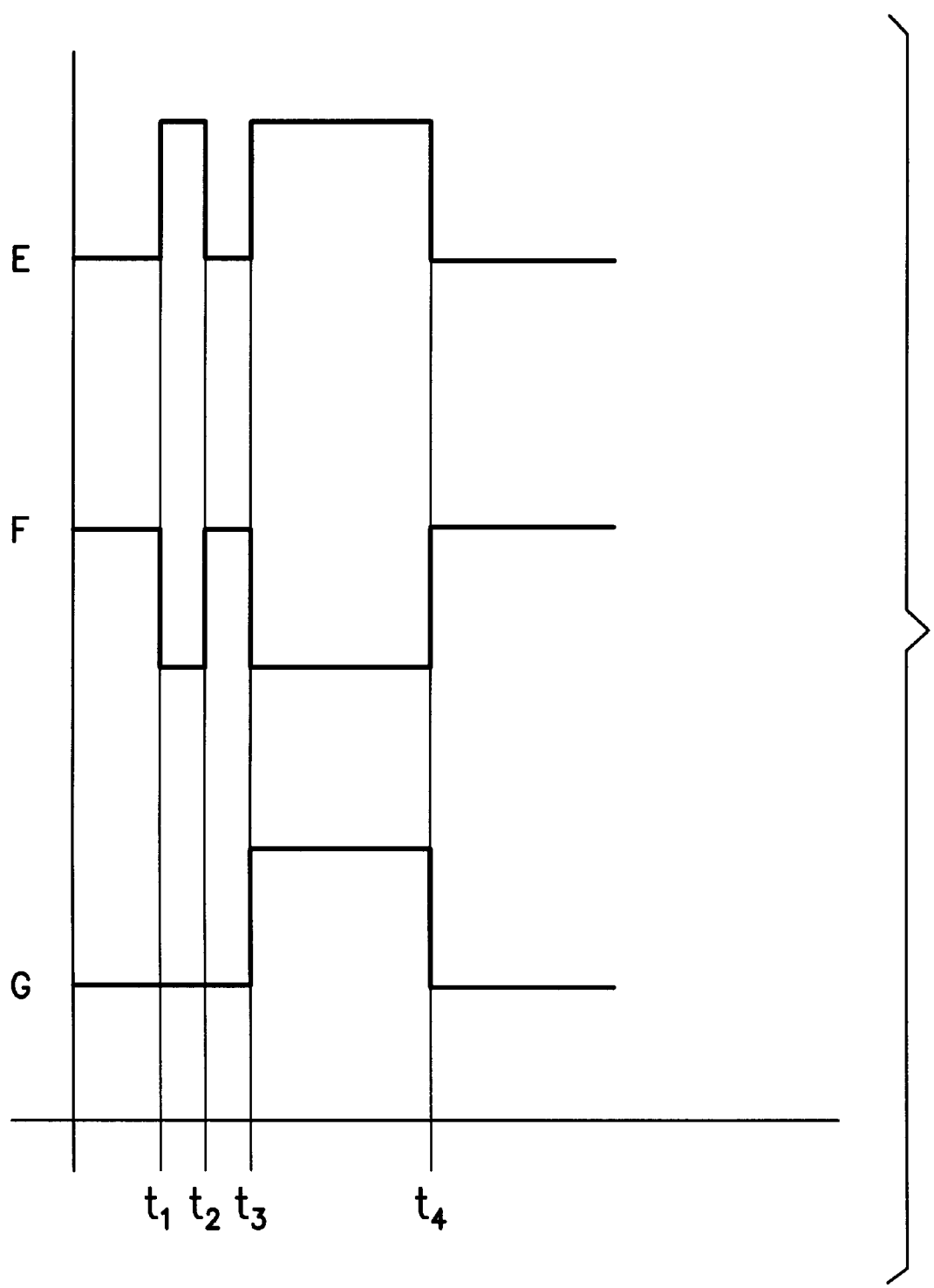
FIG. 9 is a timing diagram illustrating how the delay line reset operates to remove narrow error pulses.

According to another aspect of the invention, the time delays 12, 12' are reset when a pulse of opposite polarity is detected, i.e., the positive bits output at 16b is squelched when a negative bit is detected at the input 18b of the OR gate 18, while the negative bits output at 16b' is squelched when a positive bit is detected at the input 18b' of the OR gate 18'. In addition, narrow pulses are filtered out of the bit stream as illustrated in FIG. 9. The signal E in FIG. 9 illustrates a positive bits output of the equalizer as it enters the apparatus of the invention. The signal F in FIG. 9 illustrates the signal applied to the reset 12c of the time delay 12 in response to the signal E. The signal G in FIG. 9 illustrates the output 16b of the positive bits one shot. When the signal E is low, it is inverted by the inverter 20 so that the reset signal F is high. When the signal E goes high (representing an incoming bit) at t1 for example, the reset signal F goes low to allow the incoming bit to pass through the time delay 12. If, however, a narrow (erroneous) bit appears as shown by the signal E, the reset signal F goes high, at t2 for example, resetting the time delay before the bit can make it through the time delay. When the valid bit arrives, at t3 for example, the reset signal goes low until t4 for example, long enough to allow the bit to travel through the delay.

There have been described and illustrated herein several embodiments of a method and apparatus for correcting imperfectly equalized bipolar signals. While particular embodiments of the invention have been described, it is not intended that the invention be limited thereto, as it is intended that the invention be as broad in scope as the art will allow and that the specification be read likewise. Thus, while AND gates have been shown, it will be appreciated that other logic circuitry equivalent to those gates could be utilized. Further, while the time delay of the delay line has been disclosed as being about 20–40% of the duration of a normal correct pulse, it will be understood that the time delay need only be as long as the duration of the longest duration erroneous pulse. It will therefore be appreciated by those skilled in the art that yet other modifications could be made to the provided invention without deviating from its spirit and scope as so claimed.

What is claimed is:

1. An apparatus for correcting an imperfectly equalized bipolar digital signal, comprising:

a) a first delay line having an input and an output, the digital signal being applied to said input of said first delay line;

b) a first AND gate having two inputs and an output, said output of said first delay line being coupled to one of said inputs of said first AND gate, the digital signal being applied also to the other of said inputs of said first AND gate; and c) a first one-shot multivibrator having a signal input and a signal output, said signal input being coupled to said output of said first AND gate, wherein said output of said first AND gate provides a signal which is a corrected version of the digital signal, and said output of said first AND gate is a signal comprising a plurality of pulses at least two of which have different pulse widths, and said signal output of said first one-shot multivibrator is a signal comprising a plurality of pulses all having substantially the same pulse width.

2. An apparatus according to claim 1, wherein:

said first delay line has a reset input, the digital signal being coupled also to said input.

3. An apparatus according to claim 1, further comprising:

d) a second delay line having an input and an output, the digital signal being applied to said input of said second delay line;

e) a second AND gate having two inputs and an output, said output of said second delay line being coupled to one of said inputs of said second AND gate, the digital signal being applied also to the other of said inputs of said second AND gate, f) a second one-shot multivibrator having a signal input and a signal output, said signal input being coupled to said output of said second AND gate, wherein the digital signal has a positive bits pulse stream and a negative bits pulse stream, the positive bits pulse stream is applied to said input of said first delay line and said first AND gate, the negative bits pulse stream is applied to said input of said second delay line and said second AND gate said output of said first AND gate provides a signal which is a corrected version of the positive bits pulse stream, said output of said second AND gate provides a signal which is a corrected version of the negative bits pulse stream, said output of said first AND gate is a signal comprising a plurality of pulses at least two of which have different pulse widths, said signal output of said first one-shot multivibrator is a signal comprising a plurality of pulses all having substantially the same pulse width, said output of said second AND gate is a signal comprising a plurality of pulses at least two of which have different pulse widths, said signal output of said second one-shot multivibrator is a signal comprising a plurality of pulses all having substantially the same pulse width.

4. An apparatus according to claim 3, further comprising:

g) a first OR gate having two inputs and an output, the negative bits pulse stream being applied to one of the inputs;

h) a second OR gate having two inputs and an output, the positive bits pulse stream being applied to one of the inputs;

i) a first inverter having an input and an output, the positive bits pulse stream being applied to the input and the output being coupled to the other input of the first OR gate;

j) a second inverter having an input and an output, the negative bits pulse stream being applied to the input and the output being coupled to the other input of the second OR gate, wherein said first delay line has a reset input which is coupled to the output of said first OR gate, said second delay line has a reset input which is coupled to the output of said second OR gate, the positive bits pulse stream is a signal comprising a plurality of pulses at least one of which is an erroneous pulse, said first delay line having a delay time approximately equal to the maximum possible duration of said erroneous pulse, and the negative bits pulse stream is a signal comprising a plurality of pulses at least one of which is an erroneous pulse, said first delay line having a delay time approximately equal to the maximum possible duration of said erroneous pulse.

5. An apparatus according to claim 1, wherein:

the digital signal is a signal comprising a plurality of pulses at least one of which is an erroneous pulse, said first delay line having a delay time approximately equal to the maximum possible duration of said erroneous pulse.

6. An apparatus according to claim 2, wherein:

the digital signal is a signal comprising a plurality of pulses at least one of which is an erroneous pulse, said first delay line having a delay time approximately equal to the maximum possible duration of said erroneous pulse.

7. A method for correcting imperfectly equalized digital signal, comprising:

a) creating a delayed duplicate of the digital signal;

b) creating a corrected signal which is the logical AND of the delayed duplicate and the digital signal; and c) further correcting the corrected signal by making all of the pulses in the corrected signal substantially the same width.

8. A method according to claim 7, wherein the digital signal includes a plurality of pulses, said method further comprising:

d) altering the duplicate signal by eliminating pulses of short duration.

9. A method according to claim 7, wherein:

the digital signal is a signal comprising a plurality of pulses at least one of which is an erroneous pulse, and said step of creating a delayed duplicate of the imperfectly equalized signal comprises delaying the imperfectly equalized signal by a delay time approximately equal to the maximum possible duration of the erroneous pulse.

* * * * *